US008865628B2

(12) United States Patent
Manabe et al.

(10) Patent No.: US 8,865,628 B2
(45) Date of Patent: Oct. 21, 2014

(54) SOLUTION FOR FORMING RARE-EARTH SUPERCONDUCTIVE FILM AND PRODUCTION METHOD THEREOF

(75) Inventors: Takaaki Manabe, Ibaraki (JP); Iwao Yamaguchi, Ibaraki (JP); Toshiya Kumagai, Ibaraki (JP); Mitsugu Sohma, Ibaraki (JP); Wakichi Kondou, Ibaraki (JP); Kenichi Tsukada, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 215 days.

(21) Appl. No.: 13/514,139

(22) PCT Filed: Dec. 9, 2010

(86) PCT No.: PCT/JP2010/072104
§ 371 (c)(1),
(2), (4) Date: Jul. 10, 2012

(87) PCT Pub. No.: WO2011/071103
PCT Pub. Date: Jun. 16, 2011

(65) Prior Publication Data
US 2012/0270738 A1     Oct. 25, 2012

(30) Foreign Application Priority Data

Dec. 9, 2009  (JP) ................................. 2009-279655

(51) Int. Cl.
  H01L 39/12    (2006.01)
  H01L 39/24    (2006.01)
  C01G 3/00     (2006.01)

(52) U.S. Cl.
  CPC ............ *C01G 3/006* (2013.01); *H01L 39/2425* (2013.01)
  USPC ...... 505/512; 505/510; 505/470; 252/519.21; 252/500; 106/1.23

(58) Field of Classification Search
  CPC ............ H01L 39/2425; H01L 39/2451; H01L 39/2454; H01L 39/2477; B05D 5/12; C01G 3/006; C23C 18/1216; C23C 18/1241; C23C 18/1245
  USPC ......... 505/126, 434, 446, 470, 510, 512, 741; 427/62; 252/500, 519.21
  See application file for complete search history.

(56) References Cited

U.S. PATENT DOCUMENTS

| 5,039,654 A | 8/1991 | Mizuta et al. |
| 6,562,761 B1 | 5/2003 | Fritzemeier et al. |

(Continued)

FOREIGN PATENT DOCUMENTS

| CN | 1439747 A | 9/2003 |
| CN | 101258616 A | 9/2008 |

(Continued)

OTHER PUBLICATIONS

Patent Abstracts of Japan, One page English Language Abstract for JP 64-069516 A, Mar. 1989.

(Continued)

*Primary Examiner* — Stanley Silverman
*Assistant Examiner* — Kallambella Vijayakumar
(74) *Attorney, Agent, or Firm* — Howson & Howson LLP

(57) ABSTRACT

Provided is a coating solution where, upon producing a rare-earth superconductive composite metal oxide film by means of a coating-pyrolysis method, cracks are not generated in the heat treatment process for eliminating organic components, even when the thickness of the rare-earth superconductive film produced in a single coating is 500 nm or more, and without having to repeat the coating and annealing process. A solution for producing a rare-earth superconductive film which is made into a homogeneous solution by dissolving, in a solvent formed by adding a polyhydric alcohol to a univalent linear alcohol having a carbon number of 1 to 8 and/or water, a metal complex coordinated, relative to metal ions of a metallic species containing rare-earth elements, barium and copper, with pyridine and/or at least one type of tertiary amine, at least one type of carboxylic acid having a carbon number of 1 to 8, and, as needed, an acetylacetonato group.

4 Claims, 1 Drawing Sheet

(56) References Cited

U.S. PATENT DOCUMENTS

| | | | |
|---|---|---|---|
| 6,821,930 B2* | 11/2004 | Araki et al. | 505/440 |
| 2006/0094603 A1 | 5/2006 | Li et al. | |
| 2009/0318296 A1* | 12/2009 | Sohma et al. | 505/325 |
| 2010/0015340 A1* | 1/2010 | Clem et al. | 427/372.2 |
| 2010/0093545 A1 | 4/2010 | Cima et al. | |

FOREIGN PATENT DOCUMENTS

| | | | |
|---|---|---|---|
| JP | S64-65003 A | 3/1989 | |
| JP | S64-65007 A | 3/1989 | |
| JP | S64-69516 A | 3/1989 | |
| JP | 01-234305 A | 9/1989 | |
| JP | 05-009022 A | 1/1993 | |
| JP | 05-147941 A | 6/1993 | |
| JP | H05-147941 A | 6/1993 | |
| JP | 2002-284526 A | 10/2002 | |
| JP | 2006-096577 A | 4/2006 | |
| WO | 01/08236 A1 | 2/2001 | |
| WO | WO 2008/096728 * | 8/2008 | H01L 39/24 |

OTHER PUBLICATIONS

I. Matsubara et al., "Preparation of Epitaxial YbBa2Cu3O7-o on SrTiO3 Single Crystal Substrates Using a Solution Process", Japanese Journal of Applied Physics, vol. 38, Issue No. 7A, (Abstract only) Jul. 1999.

Joanna McKittrick et al., "Chemical Synthesis of Spun-on Thick Films of Oxide Superconductors", Thin Solid Films, vol. 206, pp. 146-150, 1991 (month unknown).

A. Gupta et al., "Superconducting Oxide Films with High Transition Temperature Prepared from Metal Triflouroacetate Precursors", Applied Physics Letters, vol. 52, (Abstract only), Jun. 1988.

P.C. McIntyre et al., "Texture Development in Ba2YCu3O7-x Films from Triflouroacetate Precursors", Journal of Materials Research, vol. 5, (Abstract only), Dec. 1990.

W.T. Wang et al., "Chemical Solution Deposition of YBCO Thin Film by Different Polymer Additives", Physica C, vol. 468, (Abstract only), 2008 (month unknown).

Takeshi Araki et al., "Fabrication of YBCO Films by Metalorganic Deposition using Trifluoroacetates and its Process Conditions", Cryogenics Engineering., vol. 35, No. 11, pp. 516-522, Aug. 14, 2000.

* cited by examiner

SOLUTION FOR FORMING RARE-EARTH SUPERCONDUCTIVE FILM AND PRODUCTION METHOD THEREOF

BACKGROUND ART

The present invention relates to the production of a superconductive composite metal oxide film for application in a superconductive microwave device, a fault current limiter, a tape, a wire and the like.

Various methods for forming an oxide superconductor film have been developed.

Among these methods, there is a metal organic deposition, which uses, as the raw material, a solution containing an organic compound including an atomic species which forms a superconductive film on various types of substrate materials, coats the foregoing solution on a substrate, performs heat treatment so as to thermally decompose the coated film, and thereby forms a superconductive film. With this method, the following are demanded; namely, to dissolve metal organic compounds containing atomic species which comprise superconductive composite metal oxide in a solvent as homogeneously as possible to prepare a homogeneous mixed solution, to coat this solution evenly on a substrate material, to perform heat treatment and subject the metal organic substance to pyrolysis treatment so as to eliminate only the organic components, and to perform high temperature heat treatment so as to uniformly form a superconductive film via solid-phase reaction or liquid-phase reaction. The present inventors have been actively involved in the development of the foregoing method, and devised inventions pertaining to a method of producing a superconductive film, and a coating solution (Patent Documents 1 and 2).

Known is an invention by Kumagai et al. in relation to the method of using low oxygen partial pressure or decompression upon performing high temperature heat treatment (Patent Documents 3 and 4). This method is characterized in an inexpensive production method compared to a vacuum evaporation method or the like, since a vacuum device is not required, and is also characterized in that deposition onto a long or large-area substrate is easy. This production method was highly appreciated from the perspective that the characteristics of the superconductive film produced with said method are also favorable compared to other production methods.

Encouraged by the success of forming superconductive films based on the coating-pyrolysis method, research and development concerning the preparation of superconductive films using similar methods were actively conducted in organizations throughout the world, and the following methods have been publicly announced.

U.S. IBM Thomas J. Watson Research Center, and subsequently Massachusetts Institute of Technology announced that a superconductor can be formed by coating a trifluoroacetate solution on a substrate material, and performing heat treatment thereto in a water-vapor atmosphere (Non-Patent Documents 1 and 2). Subsequently, Superconductivity Research Laboratory announced that it improved and optimized the foregoing process and succeeded in preparing a superconductive film having high critical current characteristics (Non-Patent Document 3). Upon using the foregoing organic compound containing fluorine as the starting raw material, high critical current characteristics can be obtained, but there is a problem in that hydrogen fluoride, which is toxic and environmentally burdensome, is generated during the heat treatment.

Meanwhile, when metal organic acid salt or acetylacetonate which does not contain fluorine is used as the raw material, hydrogen fluoride is not generated during the heat treatment. Nevertheless, when applying this method to usage which requires a thick film of an oxide superconductor such as with a superconductive microwave device, a tape or a wire, upon coating a metal organic compound solution on a substrate and performing a heat treatment process to eliminate the organic components, cracks will occur in the heat treatment process of eliminating the organic components if the thickness of a single-coat film which is expressed as the thickness of the produced oxide superconductor film ("single-coat equivalent film thickness" hereinafter) becomes 500 nm or more. Since these cracks cannot be mended even with the subsequent high temperature heat treatment, the characteristics of the ultimately formed superconductive film will deteriorate considerably. Thus, in order to avoid the generation of cracks in the heat treatment process of eliminating the organic components, the coating and pyrolysis process need to be repeated so that a single-coat equivalent film thickness is reduced to roughly 100 to 300 nm, and a problem of increase in time, work and required energy will arise.

Thus, in order to increase the film thickness of a single coating, proposed is increasing the viscosity by adding a macromolecular additive agent such as polyvinyl butyral, polyethylene glycol, or polyvinyl pyrrolidone to the solution. Nevertheless, under the current circumstances, a thickness of up to only 400 nm can be achieved (Non-Patent Document 4).

PRIOR ART DOCUMENTS

[Patent Document 1] Japanese Examined Patent Application Publication No. H4-76323
[Patent Document 2] Japanese Examined Patent Application Publication No. H4-76324
[Patent Document 3] Japanese Examined Patent Application Publication No. H7-10732
[Patent Document 4] Japanese Examined Patent Application Publication No. H7-106905
[Non-Patent Document 1] A. Gupta at al., Appl. Phys. Lett. 52 (1988) 2077
[Non-Patent Document 2] P. C. McIntyre et al., J. Mater. Res. 5 (1990) 2771
[Non-Patent Document 3] Araki et al., Cryogenic Engineering 35 (2000) 516
[Non-Patent Document 4] W. T. Wang et al., Physica C 468 (2008) 1563

SUMMARY OF THE INVENTION

Problems to be Solved by the Invention

The present invention was devised in view of the foregoing circumstances, and an object of this invention is to provide a coating solution where, upon producing a rare-earth superconductive composite metal oxide film (hereinafter referred to as the "rare-earth superconductive film") by means of a coating-pyrolysis method, cracks are not generated in the heat treatment process for eliminating organic components, even when the single-coat equivalent film thickness is 500 nm or more without having to repeat the coating and pyrolysis process.

Means for Solving the Problems

In the production of a rare-earth superconductive film, the cause of generation of cracks when a single-coat equivalent film thickness becomes 500 nm or more is considered to be that the contraction of a large volume occurs and the stress in the film becomes uneven in the process of calcinating a thin film of a metal-containing compound at 200 to 650° C. in order to eliminate the organic components and form a calcined film.

Thus, as a result of intense study to achieve the foregoing object, the present inventors examined various additives to be added to the coating solution, and consequently discovered that the addition of a polyhydric alcohol enables to prepare a coating solution in which cracks are not generated in the heat treatment process of eliminating the organic components even when the single-coat equivalent film thickness is 500 nm or more.

The present invention was completed based on the foregoing discovery, and the following invention is provided according to the present invention.

[1] A solution for producing a rare-earth superconductive film, wherein the solution is made into a homogeneous solution by dissolving, in a solvent formed by adding a polyhydric alcohol to a univalent linear alcohol having a carbon number of 1 to 8 and/or water, a metal complex coordinated, relative to metal ions of a metallic species containing rare-earth elements, barium and copper, with pyridine and/or at least one type of tertiary amine, at least one type of carboxylic acid group having a carbon number of 1 to 8, and, as needed, an acetylacetonato group.

[2] The solution for producing a rare-earth superconductive film according to [1] above, wherein the polyhydric alcohol is at least one type selected from a bivalent alcohol and a trivalent alcohol.

[3] A method of producing a solution for producing a rare-earth superconductive film, wherein pyridine and/or at least one type of tertiary amine, and at least one type of carboxylic acid having a carbon number of 1 to 8 are added to metal carboxylate having a carbon number of 1 to 8 and/or metal acetylacetonate powder mixture of a metallic species containing rare-earth elements, barium and copper to produce a metal complex, excessive solvent is evaporated, the product solid residue is dissolved in a univalent linear alcohol having a carbon number of 1 to 8 and/or water, and a polyhydric alcohol is additionally added to obtain a homogeneous solution.

[4] The method of producing a solution for producing a rare-earth superconductive film according to [3] above, wherein the polyhydric alcohol is at least one type selected from a bivalent alcohol and a trivalent alcohol.

Effect of the Invention

The present invention enables to realize resource saving, energy conservation, and cost reduction, since the number of processes of coating the raw material solution and the number of heat treatment processes for eliminating the organic components can be reduced in the formation of a rare-earth superconductive film having a film thickness of 500 nm or more, the whole process can be shortened.

DETAILED DESCRIPTION OF THE INVENTION

Figure 1:
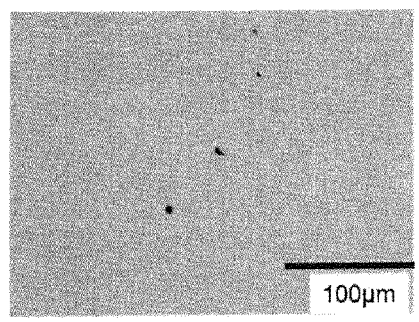
FIG. 1 is a diagram showing the results upon confirming, with an optical microscope, the existence of cracks when triethylene glycol was used as the additive agent.

The solution for producing a rare-earth superconductive film of the present invention is unique in that the solution is made into a homogeneous solution by dissolving, in a solvent formed by adding a polyhydric alcohol to a univalent linear alcohol having a carbon number of 1 to 8 and/or water, a metal complex coordinated, relative to metal ions of a metallic species containing rare-earth elements, barium and copper, with pyridine and/or at least one type of tertiary amine, at least one type of carboxylic acid group having a carbon number of 1 to 8, and, as needed, an acetylacetonato group.

The homogeneous solution of the present invention containing metal complex contains, as essential components, the respective metal components of rare-earth metals, barium (Ba), and copper (Cu). This solution is used for forming an oxide superconductor film, and can also be used for synthesizing inorganic compounds containing the foregoing metal components via heat treatment.

The rare-earth metal elements as the foregoing essential component include yttrium (Y) and the lanthanoid elements of lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu). A plurality of metals selected from the above may be used as the rare-earth metals.

For the purpose of producing a superconductive film, the electrical properties of the obtained superconductive film can be modified by adding trace amounts of cerium (Ce) or praseodymium (Pr) other than the foregoing rare-earth metals or other components such as calcium or strontium, in addition to the essential metal components as the foregoing rare-earth metals, barium and copper.

Other components may also be used so long as they can be used as a metallic species that can be used upon forming the superconductive film.

Upon forming a superconductive film from rare-earth metals, barium, and copper, as the ratio of such rare-earth metals, barium and copper, there are, for example, a rare earth 123 system (in the ensuing explanation, when yttrium is the rare-earth metal, this is indicated as Y123) superconductive film having a ratio of 1:2:3, and a rare earth 124 system (in the ensuing explanation, when yttrium is the rare-earth metal, this is indicated as Y124) superconductive film having a ratio of 1:2:4. Preferably, the mixing ratio of the elemental species in the raw material solution is 1:2:3 to 1:2:4 based on a molar ratio. However, the ratio is not limited to the foregoing range since it is also possible to yield favorable results even with a composition with a reduced ratio of barium.

It is possible to form a superconductor containing the foregoing additive element or its compound, by adding, to the foregoing solution, a univalent metal such as silver, a bivalent metal such as calcium or strontium, a trivalent metal such as rare-earth metals other than the essential rare-earth metals configuring the superconductive phase, or a quadrivalent metal such as zirconium or hafnium. Since a superconductor containing an additive element such as calcium or strontium or the compound thereof will possess electrical properties that are different from the superconductor that does not contain such additive element or compound, the electrical properties of the superconductor can be modified by controlling the ratio of metals contained in the solution. The electrical properties of the superconductor are the critical temperature and critical current density, for example.

With the solution of the present invention, a metal complex coordinated with pyridine and/or at least one type of tertiary amine, at least one type of carboxylic acid group having a carbon number of 1 to 8, and, as needed, an acetylacetonato group is homogenously dissolved in the foregoing metal ions.

As the "tertiary amine" as one type of ligand in the metal complex, used are trimethylamine, triethylamine, tripropylamine, tributylamine and the like. As the carboxylic acid of the "carboxylic acid group having a carbon number of 1 to 8", used are 2-ethylhexanoic acid, caprylic acid, butyric acid, propionic acid, acetic acid, oxalic acid, citric acid, lactic acid, benzoic acid, salicylic acid or the like.

In order to produce the metal complex of the present invention, pyridine and/or at least one type of tertiary amine, and at least one type of carboxylic acid having a carbon number of 1 to 8 are added to metal carboxylate having a carbon number of 1 to 8 and/or metal acetylacetonate powder mixture of a metallic species containing rare-earth elements, barium and copper.

The solution for producing a rare-earth superconductive film of the present invention is made into a homogeneous solution as a result of the foregoing metal complex being dissolved in a solvent formed by adding a polyhydric alcohol to a univalent linear alcohol having a carbon number of 1 to 8 and/or water.

In other words, the solution for producing a rare-earth superconductive film of the present invention is produced by adding, to the foregoing powder mixture, pyridine and/or at least one type of tertiary amine, and at least one type of carboxylic acid having a carbon number of 1 to 8 to produce a metal complex, evaporating the excessive solvent, and dissolving the residue in a univalent linear alcohol having a carbon number of 1 to 8 and/or water, and further adding a polyhydric alcohol thereto.

As the foregoing univalent linear alcohol having a carbon number of 1 to 8, the following may be used: methanol, ethanol, n-propanol, n-butanol, n-pentanol, n-hexanol or the like, and the mixture thereof.

Moreover, water may also be used to dissolve the metal complex, and the mixture of one or more types of the foregoing univalent linear alcohols having a carbon number of 1 to 8 and water may also be used.

In the present invention, the effect of preventing the generation of cracks during calcination is yielded by using a solvent formed by adding a polyhydric alcohol to the foregoing linear alcohol having a carbon number of 1 to 8 and/or water.

As the polyhydric alcohol used in the present invention, the following may be used: ethylene glycol, hexylene glycol, octylene glycol, glycerin, diethylene glycol, triethylene glycol, tetraethylene glycol, propylene glycol or the like.

The method of producing a rare-earth superconductive film by using the solution for producing a rare-earth superconductive film of the present invention is now explained.

[Coating Process of Raw Material Solution]

This is the process of coating the foregoing solution on a substrate material and forming a thin film of a metal-containing compound solution. Here, as the solution coating method, various conventionally known methods may be used: the dipping method, spin coating method, spraying method, brush coating method, for example.

As the substrate material, various materials and various shapes may be used. Here, as the material that are used are, for instance, metals and alloys such as nickel, copper, gold, silver, stainless steel and hastelloy, metal oxides such as alumina, zirconia, titanic, strontium titanate, lanthanum aluminate, neodymium gallate, and yttrium aluminate, and ceramics such as silicon carbide. The shape thereof may be, whether curved or flat, an arbitrary shape including a plate-like, linear, coiled, fibrous, knitted, and tubular. The substrate material may also be porous. It is also possible to form in advance, as an intermediate layer, a metal film or a metal oxide film of zirconia or ceria on the surface of the substrate material in order to prevent the reaction of the composite metal oxide and the substrate material and/or to alleviate the lattice mismatch of the two.

[Drying Process]

The solution coated film formed on the substrate material as described above is dried at a room temperature or an elevated temperature under ordinary pressure or reduced pressure. Since the drying can be completed in the initial stage of the calcination process to be performed after the foregoing drying process, the coated film does not have to be completely dried in the drying process. Moreover, since the subsequent calcination process can be used to double as the drying process, it is also possible to omit the foregoing drying process.

[Calcination Process]

This is the process of heating and pyrolyzing the metal-containing compound film formed on the substrate material as described, and transforming the film into a film made of barium carbonate, rare-earth oxide and copper oxide. The maximum heating temperature is 400 to 650° C., preferably 450 to 550° C., and the temperature gradually increased to the foregoing range and maintained for 20 to 600 minutes, preferably 150 to 300 minutes with a single-coat equivalent film thickness being 500 nm or more and the temperature is thereafter decreased. As the pyrolyzing atmosphere, an atmosphere of air, oxygen, nitrogen, argon or the like is used. With a single-coat equivalent film thickness being 500 nm or more, preferably adopted is an atmosphere containing water vapor having an oxygen partial pressure of 0.2 to 0.8 atm and a dew point of 20° C. or higher.

[Annealing Process]

This is the process of heat-treating the film formed with the calcination process to eliminate carbon dioxide from the barium carbonate, and causing the barium carbonate and the rare-earth oxide and the copper oxide to react. In the present invention, the annealing process is performed under conditions where the oxygen partial pressure in the atmosphere is 0.01 to 100 Pa, preferably 1 to 20 Pa. The condition of the oxygen partial pressure being 0.01 to 100 Pa can be achieved by using inert gas. The annealing process can also be performed under reduced pressure where the oxygen partial pressure is 0.01 to 100 Pa, preferably 1 to 20 Pa. As a result of adopting the foregoing heat-treatment conditions, the decomposition of the barium carbonate in the film formed with the calcination process is promoted, and a composite metal oxide film is formed. Moreover, since a low oxygen partial pressure condition is adopted in the annealing process as described above, the decomposition of the barium carbonate can be smoothly implemented at a lowered temperature, and the reaction between the substrate material and/or the intermediate layer and the composite metal oxide can be substantially avoided. The standard heat-treatment temperature in the foregoing process is 650 to 900° C. As a result of adopting the foregoing heat-treatment conditions of the present invention, it is possible to substantially prevent the reaction between the substrate material and/or the intermediate layer and the composite metal oxide which occurred in the conventional technologies.

[Oxidizing Process]

This is the process of subjecting the composite metal oxide film formed with the foregoing annealing process to oxidation treatment by using free oxygen, and thereby forming a composite metal oxide film having superconductivity. Since the oxygen partial pressure in the atmosphere was retained at 0.01 to 100 Pa in the foregoing annealing process, the superconductive properties of the obtained composite metal oxide film were unsatisfactory, but as a result of performing the oxidizing process, it is possible to transform the film into a composite metal oxide film having superior superconductive properties. The oxidizing process of causing the film to absorb oxygen is preferably performed at an oxygen partial pressure of 0.2 to 1.2 atm. As the free oxygen, pure oxygen or air is used. When air is used as the oxidizing agent, the carbon dioxide contained in the air will have adverse effects on the superconductive properties of the film. Thus, the carbon dioxide partial pressure in the air is preferably reduced, via decarbonation, to 1 Pa or less, preferably 0.5 Pa or less. The oxidizing process is performed at a moderate high temperature, and it is possible to substantially avoid the reaction between the substrate material and/or the intermediate layer and the composite metal oxide. The temperature of the oxidizing process is generally 400 to 900° C. When implementing the method of the present invention, the processes of calcination, annealing and oxidizing may be continuously performed within the same apparatus.

As a result of using the solution of the present invention, it is possible to form a superconductive composite metal oxide film having a film thickness of 500 nm or more on the substrate material only by performing each of the processes once.

EXAMPLES

The present invention is now explained with reference to the Examples, but the present invention is not in any way limited by these Examples.

Example 1

Preparation of Calcined Film

Metal acetylacetonate powders of commercially available yttrium, barium and copper (manufactured by Nihon Kagaku Sangyo Co., Ltd.) were weighed so that the molar ratio of the metal components becomes 1:2:3, and mixed to obtain a powder mixture. Pyridine and propionic acid were added to the mixture in an amount until the entire powder mixture dissolved. The product was subject to evaporation to eliminate the excess amount of pyridine and propionic acid, and an acetylacetonato group-propionic acid group-pyridine coordinated metal complex of an amorphous solid residue was obtained.

It was confirmed that this complex solid residue could be dissolved without leaving any precipitation in the solvent such as water or alcohol, and that a homogeneous solution could be obtained.

Subsequently, the product was dissolved in a mixed solvent of n-butanol and water to obtain a coating solution made from a liquid-state metal complex (including the three types of ligands that are acetylacetonato group, pyridine, and propionic acid group) in which the ratio of metal elements is Y:Ba:Cu=1:2:3. The concentration of the solution was set so that 0.2 to 0.3 millimoles of rare-earth metallic species are contained per 1 g of the solution.

Furthermore, one among ethylene glycol, hexylene glycol, octylene glycol, glycerin, diethylene glycol, triethylene glycol, tetraethylene glycol, and propylene glycol was added as an additive agent to the foregoing solution in an amount of 0.02 to 0.04 ml per 1 g of the solution so as to prepare a homogeneous coating solution. This solution was coated, via spin coating, on a sapphire substrate in which cerium oxide was vacuum-deposited on the surface in advance. Subsequently performed was calcination of heating up the obtained coated film to 500° C. in air current containing moisture having an oxygen partial pressure of 0.6 atm and a dew point of 24° C. so as to eliminate the organic components.

The respective additive agents that were used are shown in Table 1 below.

TABLE 1

| Name of Substance | | Viscosity (cps) | Boiling Point (° C.) |
|---|---|---|---|
| Ethylene glycol | $HOCH_2CH_2OH$ | 26 | 197 |
| 1,2-propylene glycol | $CH_3CHOHCH_2OH$ | 56 | 188 |
| Hexylene glycol | $(CH_3)_2COHCH_2CHOHCH_3$ | 34 | 197-198.5 |
| Octylene glycol | $CH_2OHCH(C_2H_5)CHOHC_3H_7$ | 323 | 244 |
| Diethylene glycol | $HOCH_2CH_2OCH_2CH_2OH$ | 38 | 245 |
| Triethylene glycol | $HOC_2H_4OC_2H_4OC_2H_4OH$ | 48 | 278 (287.4) |
| Tetraethylene glycol | $HOC_2H_4OC_2H_4OC_2H_4OC_2H_4OH$ | 55 | 327 |
| Glycerin | $CH_2OH•CHOH•CH_2OH$ | 945 | 290 |

Source: Solvent Handbook (Written and Edited by Tanemitsu Matsuda et al., Published by Sangyo Tosho, Issued in 1963)

As a result of preparing a calcined film as described above so that the single-coat equivalent film thickness was 510 to 580 nm, as shown in Table 2 below, no cracks could be observed on the surface in the use of any of the additive agents.

Note that, in the Tables, the criteria for determining the condition of the film was as follows. Specifically, the naked eye and the optical microscope VH7000 manufactured by Keyence were used to observe the entire surface of the film at ×40 to ×100, and several locations on the film at ×100 to ×1000, and those in which cracks could not be observed were indicated as "No cracks".

FIG. 1 shows the results upon confirming, with an optical microscope, the existence of cracks when triethylene glycol was used as the additive agent as one example.

Comparative Example 1

Preparation of Calcined Film

The same method as Example 1 was used to prepare a calcined film, other than adding polyethylene glycol (400; manufactured by Wako Pure Chemical Industries, Ltd.) as the additive agent in an amount of 0.02 ml per 1 g of the solution. As shown in Table 2 below, narrow cracks had formed on the surface.

Figure 2:
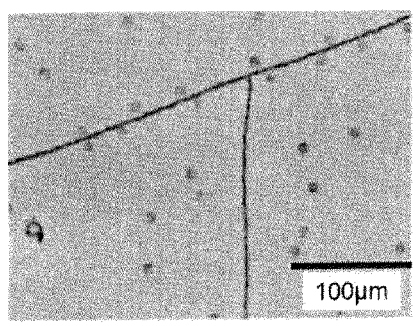
FIG. 2 is a diagram showing the results upon confirming, with an optical microscope, the existence of cracks when polyethylene glycol was used as the additive agent.

Regarding Comparative Example 1, FIG. 2 shows the results confirmed using an optical microscope.

Comparative Example 2

Preparation of Calcined Film

The same method as Example 1 was used to prepare a calcined film, other than not adding an additive agent. As shown in Table 2 below, wide cracks had formed on the surface.

TABLE 2

| | Additive Agent | Additive Amount (ml/g solution) | Film Thickness (nm) | Condition of Film | Judgment |
|---|---|---|---|---|---|
| Example 1 | Ethylene glycol | 0.04 | 510 | No cracks | ○ |
| | Propylene glycol | 0.02 | 530 | No cracks | ○ |
| | Hexylene glycol | 0.02 | 520 | No cracks | ○ |
| | Octylene glycol | 0.02 | 580 | No cracks | ○ |
| | Diethylene glycol | 0.02 | 560 | No cracks | ○ |
| | Triethylene glycol | 0.02 | 560 | No cracks | ○ |
| | Tetraethylene glycol | 0.02 | 570 | No cracks | ○ |
| | Glycerin | 0.02 | 580 | No cracks | ○ |
| Comparative Example 1 | Polyethylene glycol | 0.02 | 550 | Narrow cracks | X |
| Comparative Example 2 | None | — | 590 | Wide cracks | X |

Example 2

Preparation of Superconductor Film

The same method as Example 1 was used to prepare a calcined film, other than using an yttria stabilized zirconia single-crystal substrate in which cerium oxide was vacuum-deposited on the surface in advance, and using one among hexylene glycol, octylene glycol, and tetraethylene glycol as the additive agent.

The obtained calcined film was subject to the annealing process that was performed at 760° C. for 2 hours in a gas flow having an oxygen partial pressure of 10 Pa, and to the oxygenation process at an atmospheric pressure, whereby a Y123 superconductor film having a film thickness of 550 nm was prepared.

The Y123 film prepared as described above was observed with the naked eye and an optical microscope of ×40 to ×1000: it had no cracks in any of the cases. The results are shown in Table 3.

Figure 3:
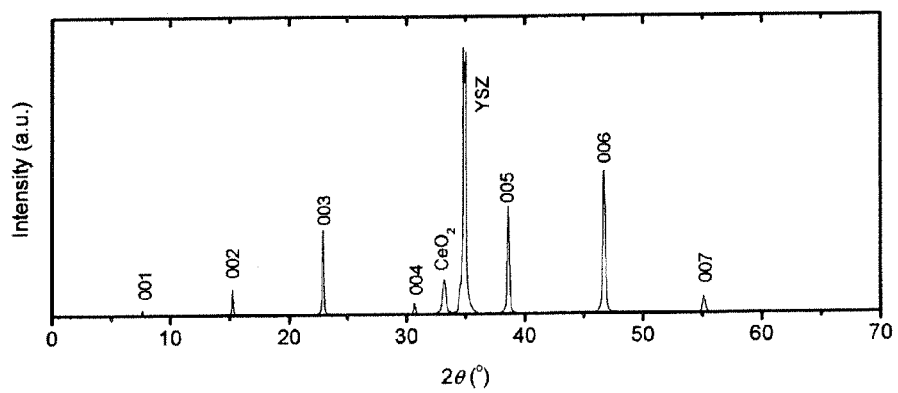
FIG. 3 is a diagram showing the results of the X-ray diffraction of the rare-earth superconductive film that was prepared by using hexylene glycol as the additive agent.

Moreover, the growth of a c-axis oriented film was confirmed in all cases via X-ray diffraction using the X-ray diffractometer of Mac Science MXP3. FIG. 3 shows the results of the X-ray diffraction of the film that was prepared by using hexylene glycol as the additive agent as one example.

TABLE 3

| | Additive Agent | Additive Amount (ml/g solution) | Film Thickness (nm) | Condition of Film | Judgment |
|---|---|---|---|---|---|
| Example 2 | Hexylene glycol | 0.02 | 550 | No cracks | ○ |
| | Octylene glycol | 0.02 | 550 | No cracks | ○ |
| | Tetraethylene glycol | 0.02 | 550 | No cracks | ○ |
| Comparative Example 3 | None | — | 550 | Wide cracks | X |

In the foregoing Tables, the criteria for determining the condition of the film were as follows. Specifically, the naked eye and the optical microscope VH7000 manufactured by Keyence were used to observe the entire surface of the film at ×40 to ×100, and several locations on the film at ×100 to ×1000, and those in which cracks could not be observed were indicated as "No cracks".

Comparative Example 3

Preparation of Superconductor Film

The same method as Example 2 was used to prepare a Y123 superconductor film having a film thickness of 550 nm, other than not adding an additive agent. As shown in Table 3 above, wide cracks had formed on the surface.

Example 3

Preparation of Superconductor Film

The same method as Example 2 was used to prepare a Y123 superconductor film having a single-coat film thickness of 550 nm, other than setting the molar ratio of the metal components of yttrium, barium and copper to 1:2:3.7. The Y123 film prepared as described above was observed: it showed no cracks in any of the cases with the naked eye and an optical microscope of ×40 to ×1000, and the growth of a c-axis oriented Y123 film was confirmed via X-ray diffraction.

Example 4

Preparation of Superconductor Film

The same method as Example 2 was used to prepare a Y123 superconductor film having a single-coat film thickness of 550 nm, other than setting the molar ratio of the metal components of yttrium, barium and copper to 1:1.6:3. The Y123 film prepared as described above was observed: it had no cracks in any of the cases with the naked eye and an optical microscope of ×40 to ×1000, and the growth of a c-axis oriented Y123 film was confirmed via X-ray diffraction.

Example 5

Preparation of Superconductor Film

The same method as Example 2 was used to prepare a Y123 superconductor film having a single-coat film thickness of 550 nm, other than using a mixed solvent of n-pentanol and water as the solvent for dissolving the complex solid residue. The Y123 film prepared as described above was observed: it had no cracks in any of the cases with the naked eye and an optical microscope of ×40 to ×1000, and the growth of a c-axis oriented Y123 film was confirmed via X-ray diffraction.

Example 6

Preparation of Superconductor Film

The same method as Example 2 was used to prepare a Y123 superconductor film having a single-coat film thickness of 550 nm, other than using metal acetate powders of commercially available yttrium, barium and copper (manufactured by Wako Pure Chemical Industries, Ltd.) as the starting raw material and using trimethylamine and propionic acid as the solvent. The Y123 film prepared as described above was observed: it had no cracks in any of the cases with the naked eye and an optical microscope of ×40 to ×1000, and the growth of a c-axis oriented Y123 film was confirmed via X-ray diffraction.

Example 7

Preparation of Superconductor Film

The same method as Example 2 was used to prepare a Y123 superconductor film having a film thickness of 680 nm, other than using a strontium titanate single-crystal substrate in which cerium oxide was vacuum-deposited on the surface in advance as the substrate.

The Y123 film prepared as described above was observed with the naked eye and an optical microscope of ×40 to ×1000: it had no cracks in any of the cases. Moreover, the growth of a c-axis oriented Y123 film was confirmed via X-ray diffraction using an X-ray diffractometer.

Upon measuring the critical current density of the obtained Y123 film via the inductive method at a liquid nitrogen temperature, the result was 2.1 MA/cm$^2$.

The invention claimed is:

1. A solution for producing a rare-earth superconductive film, wherein the solution is made into a homogeneous solution by dissolving, in a solvent formed by adding a polyhydric alcohol to a univalent linear alcohol having a carbon number of 1 to 8 and water, a metal complex coordinated, relative to metal ions of a metallic species containing rare-earth elements, barium and copper, with pyridine and/or at least one type of tertiary amine, at least one type of carboxylic acid group having a carbon number of 1 to 8, and, as needed, an acetylacetonato group.

2. The solution for producing a rare-earth superconductive film according to claim 1, wherein the polyhydric alcohol is at least one type selected from a bivalent alcohol and trivalent alcohol.

3. A method of producing a solution for producing a rare-earth superconductive film, wherein pyridine and/or at least one type of tertiary amine, and at least one type of carboxylic acid having a carbon number of 1 to 8 are added to metal carboxylate having a carbon number of 1 to 8 and/or metal acetylacetonate powder mixture of a metallic species containing rare-earth elements, barium and copper to produce a metal complex, excessive solvent is evaporated, the product is dissolved in a univalent linear alcohol having a carbon number of 1 to 8 and water, and a polyhydric alcohol is additionally added to obtain a homogeneous solution.

4. The method or producing a solution for producing a rare-earth superconductive film according to claim 3, wherein the polyhydric alcohol is at least one type selected from a bivalent alcohol and a trivalent alcohol.

* * * * *